United States Patent
Sokolov et al.

(10) Patent No.: US 7,593,263 B2
(45) Date of Patent: Sep. 22, 2009

(54) MEMORY DEVICE WITH REDUCED READING LATENCY

(75) Inventors: Dotan Sokolov, Ra'anana (IL); Gil Semo, Tel-Aviv (IL); Ofir Shalvi, Ra'anana (IL)

(73) Assignee: Anobit Technologies Ltd., Herzilia Pituach (IL)

(*) Notice: Subject to any disclaimer, the term of this patent is extended or adjusted under 35 U.S.C. 154(b) by 46 days.

(21) Appl. No.: 11/958,011

(22) Filed: Dec. 17, 2007

(65) Prior Publication Data

US 2008/0158958 A1  Jul. 3, 2008

Related U.S. Application Data

(60) Provisional application No. 60/870,399, filed on Dec. 17, 2006, provisional application No. 60/991,246, filed on Nov. 30, 2007.

(51) Int. Cl.
*G11C 16/04* (2006.01)
(52) U.S. Cl. ............... 365/185.17; 365/185.03; 365/185.28
(58) Field of Classification Search ......... 365/185.17
See application file for complete search history.

(56) References Cited

U.S. PATENT DOCUMENTS

| | | |
|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 5,056,089 A | 10/1991 | Furuta et al. |
| 5,172,338 A | 12/1992 | Mehrotta et al. |
| 5,200,959 A | 4/1993 | Gross et al. |
| 5,237,535 A | 8/1993 | Mielke et al. |
| 5,272,669 A | 12/1993 | Samachisa et al. |

(Continued)

FOREIGN PATENT DOCUMENTS

EP  0783754 B1  7/1997

(Continued)

OTHER PUBLICATIONS

Agrell et al., "Closest Point Search in Lattices", IEEE Transactions on Information Theory, vol. 48, No. 8, pp. 2201-2214, Aug. 2002.

(Continued)

*Primary Examiner*—Son L Mai
(74) *Attorney, Agent, or Firm*—Darby & Darby P.C.

(57) ABSTRACT

A method for data storage includes providing a memory, which includes first memory cells having a first reading latency and second memory cells having a second reading latency that is higher than the first reading latency. An item of data intended for storage in the memory is divided into first and second parts. The first part is stored in the first memory cells and the second part is stored in the second memory cells. In response to a request to retrieve the item of data from the memory, the first part is read from the first memory cells and provided as output. The second part is read from the second memory cells, and provided as output subsequently to outputting the first part.

40 Claims, 5 Drawing Sheets

U.S. PATENT DOCUMENTS

| | | | |
|---|---|---|---|
| 5,388,064 A | 2/1995 | Khan | |
| 5,416,782 A | 5/1995 | Wells et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,541,886 A | 7/1996 | Hasbun | |
| 5,600,677 A | 2/1997 | Citta et al. | |
| 5,657,332 A | 8/1997 | Auclair et al. | |
| 5,675,540 A | 10/1997 | Roohparvar | |
| 5,696,717 A | 12/1997 | Koh | |
| 5,726,649 A | 3/1998 | Tamaru et al. | |
| 5,751,637 A | 5/1998 | Chen et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,429 A | 2/1999 | Chen et al. | |
| 5,877,986 A | 3/1999 | Harari et al. | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,942,004 A | 8/1999 | Cappelletti | |
| 5,991,517 A | 11/1999 | Harari et al. | |
| 6,009,014 A | 12/1999 | Hollmer et al. | |
| 6,034,891 A | 3/2000 | Norman | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,166,962 A | 12/2000 | Chen et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,275,419 B1 | 8/2001 | Guterman et al. | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,363,008 B1 | 3/2002 | Wong | |
| 6,363,454 B1 | 3/2002 | Lakhani et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,442,585 B1 | 8/2002 | Dean et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,532,556 B1 | 3/2003 | Wong et al. | |
| 6,538,922 B1 | 3/2003 | Khalid et al. | |
| 6,558,967 B1 | 5/2003 | Wong | |
| 6,560,152 B1 | 5/2003 | Cernea | |
| 6,577,539 B2 | 6/2003 | Iwahashi | |
| 6,584,012 B2 | 6/2003 | Banks | |
| 6,615,307 B1 * | 9/2003 | Roohparvar | 711/103 |
| 6,621,739 B2 | 9/2003 | Gonzales et al. | |
| 6,643,169 B2 | 11/2003 | Rudelic et al. | |
| 6,678,192 B2 | 1/2004 | Gongwer et al. | |
| 6,707,748 B2 | 3/2004 | Lin et al. | |
| 6,708,257 B2 | 3/2004 | Bao | |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,781,877 B2 | 8/2004 | Cernea et al. | |
| 6,807,095 B2 | 10/2004 | Chen et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,894,926 B2 | 5/2005 | Guterman et al. | |
| 6,907,497 B2 | 6/2005 | Hosono et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 7,002,843 B2 | 2/2006 | Guterman et al. | |
| 7,012,835 B2 | 3/2006 | Gonzales et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,054,193 B1 | 5/2006 | Wong | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzales et al. | |
| 7,177,199 B2 | 2/2007 | Chen et al. | |
| 7,177,200 B2 | 2/2007 | Ronen et al. | |
| 7,187,195 B2 | 3/2007 | Kim | |
| 7,187,592 B2 | 3/2007 | Guterman et al. | |
| 7,193,898 B2 | 3/2007 | Cernea | |
| 7,193,921 B2 | 3/2007 | Choi et al. | |
| 7,196,928 B2 | 3/2007 | Chen | |
| 7,197,594 B2 | 3/2007 | Raz et al. | |
| 7,200,062 B2 | 4/2007 | Kinsely et al. | |
| 7,221,592 B2 | 5/2007 | Nazarian | |
| 7,224,613 B2 | 5/2007 | Chen et al. | |
| 7,231,474 B1 | 6/2007 | Helms et al. | |
| 7,243,275 B2 | 7/2007 | Gongwer et al. | |
| 7,254,690 B2 | 8/2007 | Rao | |
| 7,257,027 B2 | 8/2007 | Park | |
| 7,259,987 B2 | 8/2007 | Chen et al. | |
| 7,266,026 B2 | 9/2007 | Gongwer et al. | |
| 7,274,611 B2 | 9/2007 | Roohparvar | |
| 7,277,355 B2 | 10/2007 | Tanzana | |
| 7,280,398 B1 | 10/2007 | Lee et al. | |
| 7,289,344 B2 | 10/2007 | Chen | |
| 7,301,807 B2 | 11/2007 | Khalid et al. | |
| 7,308,525 B2 | 12/2007 | Lasser et al. | |
| 7,310,255 B2 | 12/2007 | Chan | |
| 7,310,272 B1 | 12/2007 | Mokhlesi et al. | |
| 7,321,509 B2 | 1/2008 | Chen et al. | |
| 7,342,831 B2 | 3/2008 | Mokhlesi et al. | |
| 7,345,928 B2 | 3/2008 | Li | |
| 7,349,263 B2 | 3/2008 | Kim et al. | |
| 7,356,755 B2 | 4/2008 | Fackenthal | |

| Patent No. | Date | Inventor(s) |
|---|---|---|
| 7,363,420 B2 | 4/2008 | Lin et al. |
| 7,397,697 B2 | 7/2008 | So et al. |
| 7,408,804 B2 | 8/2008 | Hemink et al. |
| 7,420,847 B2 | 9/2008 | Li |
| 7,433,231 B2 | 10/2008 | Aritome |
| 7,437,498 B2 | 10/2008 | Ronen |
| 7,441,067 B2 | 10/2008 | Gorobetz et al. |
| 7,453,737 B2 | 11/2008 | Ha |
| 7,468,911 B2 | 12/2008 | Lutze et al. |
| 7,471,581 B2 | 12/2008 | Tran et al. |
| 7,508,710 B2 | 3/2009 | Mokhlesi |
| 2001/0006479 A1 | 7/2001 | Ikehashi et al. |
| 2002/0118574 A1 | 8/2002 | Gongwer et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2003/0231183 A1* | 12/2003 | Ning et al. .................. 345/564 |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1* | 10/2005 | Iyer et al. .................. 711/167 |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0203546 A1 | 9/2006 | Lasser |
| 2006/0218359 A1 | 9/2006 | Sanders et al. |
| 2006/0221705 A1 | 10/2006 | Hemink et al. |
| 2006/0239077 A1 | 10/2006 | Park et al. |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1* | 1/2007 | Park .......................... 365/193 |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0266232 A1 | 11/2007 | Rodgers et al. |
| 2007/0271424 A1* | 11/2007 | Lee et al. .................... 711/156 |
| 2007/0280000 A1 | 12/2007 | Fujiu et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0055993 A1 | 3/2008 | Lee |
| 2008/0080243 A1 | 4/2008 | Edahiro et al. |
| 2008/0104309 A1 | 5/2008 | Cheon et al. |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0209304 A1 | 8/2008 | Winarski et al. |
| 2008/0219050 A1 | 9/2008 | Shalvi et al. |
| 2008/0239812 A1 | 10/2008 | Abiko et al. |
| 2008/0263262 A1 | 10/2008 | Sokolov et al. |
| 2008/0282106 A1 | 11/2008 | Shalvi et al. |
| 2009/0024905 A1 | 1/2009 | Shalvi et al. |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0089484 A1 | 4/2009 | Chu |
| 2009/0091979 A1 | 4/2009 | Shalvi |
| 2009/0106485 A1* | 4/2009 | Anholt ........................ 711/103 |
| 2009/0144600 A1 | 6/2009 | Perlmutter et al. |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008111058 A2 | 9/2008 |
| WO | 2008124760 A2 | 10/2008 |
| WO | 2008139441 A2 | 11/2008 |

| | | | |
|---|---|---|---|
| WO | 2009037691 | A2 | 3/2009 |
| WO | 2009050703 | A2 | 4/2009 |

OTHER PUBLICATIONS

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in Flash", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

ONFI, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

International Application PCT/IL2008/001446 "Optimized selection of memory chips in multi-chip memory devices" filed on Nov. 4, 2008.

Shalvi et al., U.S. Appl. No. 12/251,471 "Compensation For Voltage Drifts In Analog Memory Cells" filed on Oct. 15, 2008.

Kasorla et al, U.S. Appl. No. 12/332,370 "Efficient Data Storage in Multi-Plane Memory Devices" filed on Dec. 11, 2008.

Sommer, N., U.S. Appl. No. 12/364,531 "Parameter Estimation Based on Error Correction Code Parity Check Equations" filed on Feb. 3, 2009.

Golov et al., U.S. Appl. No. 12/344,233 "Wear Level Estimation in Analog Memory Cells" filed on Dec. 25, 2008.

Perlmutter et al., U.S. Appl. No. 12/388,528 "Programming of Analog Memory Cells Using a Single Programming Pulse per State Transition" filed on Feb. 19, 2009.

Perlmutter et al., U.S. Appl. No. 12/390,522 "Programming Analog Memory Cells for Reduced Variance After Retention" filed on Feb. 23, 2009.

Perlmutter et al., U.S. Appl. No. 12/405,275 "Memory Device with Multiple-Accuracy Read Commands" filed on Mar. 17, 2009.

Perlmutter et al., U.S. Appl. No. 12/397,368 "Efficient Readout from Analog Memory Cells Using Data Compression" filed on Mar. 4, 2009.

Sommer, N., U.S. Appl. No. 12/171,797 "Memory Device with Non-Uniform Programming Levels" filed on Jul. 11, 2008.

Perlmutter et al, U.S. Appl. No. 12/332,368 "Efficient Interference Cancellation in Analog Memory Cell Arrays" filed on Dec. 11, 2008.

US 7,161,836, 01/2007, Wan et al. (withdrawn)

\* cited by examiner

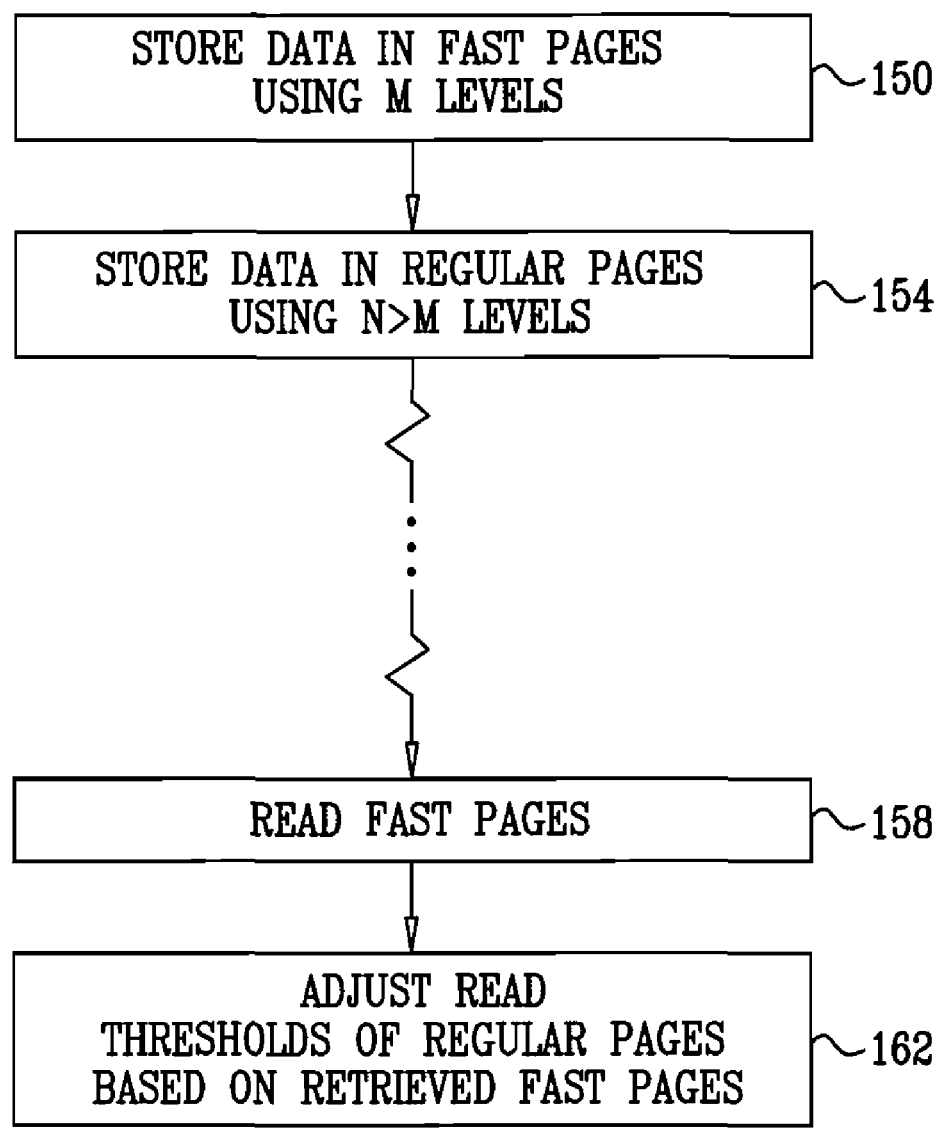

MEMORY DEVICE WITH REDUCED READING LATENCY

CROSS-REFERENCE TO RELATED APPLICATIONS

This application claims the benefit of U.S. Provisional Patent Application 60/870,399, filed Dec. 17, 2006, and U.S. Provisional Patent Application 60/991,246, filed Nov. 30, 2007, whose disclosures are incorporated herein by reference.

FIELD OF THE INVENTION

The present invention relates generally to memory devices, and particularly to methods and systems for reducing the latency of reading data from memory devices.

BACKGROUND OF THE INVENTION

Several types of memory devices, such as Flash memories, use arrays of analog memory cells for storing data. Each analog memory cell stores a quantity of an analog value, such as an electrical charge or voltage, which represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24th International Conference on Microelectronics (MIEL), Nis, Serbia and Montenegro, May 16-19, 2004, volume 1, pages 377-384, which is incorporated herein by reference.

Some known data storage methods store certain parts of the data in single-level cells and other parts of the data in multi-level cells. Such configurations are described, for example, in U.S. Pat. Nos. 5,541,886, 6,717,847 and 7,177,184, and in U.S. Patent Application Publication 2007/061502, whose disclosures are incorporated herein by reference.

SUMMARY OF THE INVENTION

Embodiments of the present invention provide a method for data storage, including:

providing a memory, which includes first memory cells having a first reading latency and second memory cells having a second reading latency that is higher than the first reading latency;

dividing an item of data intended for storage in the memory into first and second parts;

storing the first part in the first memory cells and the second part in the second memory cells; and in response to a request to retrieve the item of data from the memory, reading the first part from the first memory cells and outputting the read first part, reading the second part from the second memory cells, and outputting the read second part subsequently to outputting the first part.

In some embodiments, reading the second part includes reading the second part concurrently with outputting the first part.

In an embodiment, the first and second memory cells are formed using respective, different first and second memory device technologies. In a disclosed embodiment, the first memory cells include NOR Flash cells and the second memory cells include NAND Flash cells. In another embodiment, the memory includes an array of analog memory cells, and the first and second memory cells include respective first and second groups of the memory cells in the array.

In another embodiment, storing the first part includes programming the first memory cells using a first number of nominal analog values to assume a respective first number of possible memory states, and storing the second part includes programming the second memory cells using a second number of the nominal analog values, which is greater than the first number, to assume a respective second number of the memory states. In an embodiment, the first memory cells include Single-Level Cells (SLC), and the second memory cells include Multi-Level Cells (MLC). In another embodiment, the first number of the nominal analog values is four, and the second number of the nominal analog values is eight.

In another embodiment, reading the first part includes comparing first analog values stored in the first memory cells to a first set of reading thresholds, reading the second part includes comparing second analog values stored in the second memory cells to a second set of the reading thresholds, and the method includes adjusting the second set of the reading thresholds responsively to the read first part. In some embodiments, storing the first part includes encoding the first part using an Error Correction Code (ECC), reading the first part includes decoding the ECC, and adjusting the second set of the reading thresholds includes detecting errors in the read first part that were corrected by the ECC and adjusting the second set responsively to the detected corrected errors.

In a disclosed embodiment, the first memory cells include Random Access Memory (RAM) cells. In an embodiment, the item of data includes user data of a given type, and dividing the item of the data includes dividing the user data of the given type such that each of the first and second parts includes a portion of the user data.

In another embodiment, the first and second memory cells are arranged in respective first and second sets of memory pages, dividing the item of the data includes dividing the item into multiple fragments, assigning a number of the fragments to the first part and a remaining number of the fragments to the second part, and storing the first and second parts includes storing the number of the fragments in a subset of the first set of the memory pages and storing the remaining number of the fragments in a subset of the second set of the memory pages.

In yet another embodiment, storing the first and second parts includes encoding the first part of the item using a first Error Correction Code (ECC) scheme having a first decoding latency, and encoding the second part of the item using a second ECC scheme having a second decoding latency, which is greater than the first decoding latency. In still another embodiment, encoding the first part includes applying a first ECC, and encoding the second part includes applying a second ECC that is different from the first ECC. Additionally or alternatively, the first ECC scheme has a first ECC block size, and the second ECC scheme has a second ECC block size that is larger that the first block size.

In an embodiment, storing the first part including selecting the first memory cells responsively to a level of distortion in the cells. Selecting the first memory cells may include selecting the cells based on a number of previous programming and erasures cycles of the cells.

There is additionally provided, in accordance with an embodiment of the present invention, apparatus for data storage, including:

a memory, which includes first memory cells having a first reading latency and second memory cells having a second reading latency that is higher than the first reading latency; and a processor, which is coupled to divide an item of data intended for storage in the memory into first and second parts, to store the first part in the first memory cells and the second part in the second memory cells, and, in response to a request to retrieve the item of data from the memory, to read the first part from the first memory cells and output the read first part, to read the second part from the second memory cells, and to output the read second part subsequently to outputting the first part.

There is also provided, in accordance with an embodiment of the present invention apparatus for data storage, including:

an interface, which is coupled to communicate with a memory that includes first memory cells having a first reading latency and second memory cells having a second reading latency that is higher than the first reading latency; and a processor, which is coupled to divide an item of data intended for storage in the memory into first and second parts, to store the first part in the first memory cells and the second part in the second memory cells, and, in response to a request to retrieve the item of data from the memory, to read the first part from the first memory cells and output the read first part, to read the second part from the second memory cells, and to output the read second part subsequently to outputting the first part.

There is further provided, in accordance with an embodiment of the present invention, a method for operating a memory that includes a plurality of analog memory cells, including:

storing first data in a first group of the analog memory cells by programming the cells of the first group using a first number of nominal analog values to assume a respective first number of possible memory states;

storing second data in a second group of the analog memory cells by programming the cells of the second group using a second number of the nominal analog values to assume a respective second number of the possible memory states, which is greater than the first number;

reading the first data by comparing first analog values stored in the cells of the first group to a first set of reading thresholds;

reading the second data by comparing second analog values stored in the cells of the second group to a second set of the reading thresholds; and adjusting the second set of the reading thresholds responsively to the read first part.

There is also provided, in accordance with an embodiment of the present invention, a method for data storage, including:

providing a memory including a plurality of memory cells, wherein each memory cell stores at least first and second bits, such that the first bits of the memory cells have a first reading latency and the second bits of the memory cells have a second reading latency, which is higher than the first reading latency;

dividing an item of data intended for storage in the memory into first and second parts;

storing the first part in the first bits and the second part in the second bits of the memory cells; and in response to a request to retrieve the item of data from the memory, reading the first part from the first bits and outputting the read first part, reading the second part from the second bits, and outputting the read second part subsequently to outputting the first part.

The present invention will be more fully understood from the following detailed description of the embodiments thereof, taken together with the drawings in which:

BRIEF DESCRIPTION OF THE DRAWINGS

FIG. 7 is a flow chart that schematically illustrates a method for data storage and retrieval, in accordance with another embodiment of the present invention.

DETAILED DESCRIPTION OF EMBODIMENTS

Overview

Retrieving data from memory devices inevitably involves some reading latency. The reading latency is typically measured from the moment the host requests a particular data item (e.g., a file) to the moment the requested data begins to appear on the host interface. Since some memory controllers and host applications are sensitive to high reading latency values, it is desirable to reduce the reading latency to a minimum.

In principle, low reading latency can be achieved by using expensive and/or low density memory devices. For example, SLC devices typically have smaller reading latencies than MLC devices, but at the expense of higher cost per bit and lower storage density. As another example, NOR Flash devices typically have smaller reading latencies than NAND Flash cells, but are more expensive.

Embodiments of the present invention that are described hereinbelow provide improved methods and systems for storing and retrieving data, which provide both low reading latency and low device cost. In some embodiments, a memory comprises two types of memory cells, one type having lower reading latency than the other. For example, the lower-latency cells may comprise NOR Flash cells, and the higher-latency cells may comprise NAND Flash cells. As another example, an array of Flash memory cells can be partitioned so that some cells are used as SLC to serve as lower-latency cells, and other cells are used as MLC to serve as higher-latency cells. Typically, most of the memory cells comprise higher-latency lower-cost cells, and only a small portion of the total memory comprises higher-cost low-latency cells.

A processor or controller interacts with the host application and with the memory. The processor stores data items accepted from the host in the memory, and retrieves data items from the memory and sends them to the host. When storing a data item in the memory, the processor divides the data item into two parts. The processor stores the first part in the lower-latency cells, and the second part in the higher-latency cells. When retrieving the data item from the memory, the processor initially reads the first part of the data item from the lower-latency cells and sends the first part to the host. After reading the first part and concurrently with outputting the first part to the host, the processor reads the second part of the data item from the higher-latency cells.

Using this technique, the reading latency seen by the host is reduced to the latency of the lower-latency cells, even though only a relatively small portion of the total memory comprises such low-latency cells. Thus, the methods and systems described herein achieve low reading latency and low cost simultaneously.

System Description

Figure 1:
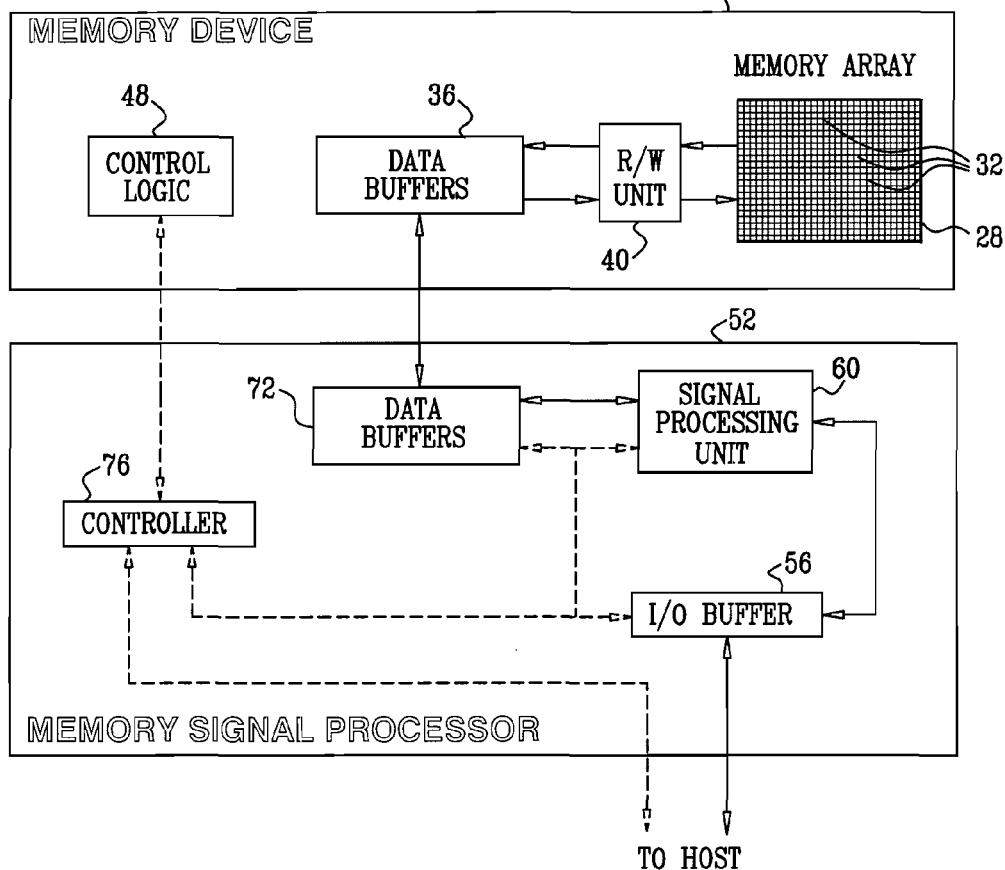
FIGS. 1 and 2 are block diagrams that schematically illustrate systems for data storage and retrieval, in accordance with embodiments of the present invention.

FIG. 1 is a block diagram that schematically illustrates a system 20 for data storage and retrieval, in accordance with an embodiment of the present invention. System 20 can be used in various host systems and devices, such as in computing devices, cellular phones or other communication terminals, removable memory modules (such as "disk-on-key" devices), Multi-Media Cards (MMC), systems and applications based on embedded MMC (eMMC™), Secure Digital (SD) cards, digital cameras, Solid State Drives (SSD), music and other media players such as MP3 or MP4 players, and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. The charge levels stored in the cells and/or the analog voltages or currents written into and read out of the cells are referred to herein collectively as analog values.

System 20 stores data in the analog memory cells by programming the cells to assume respective memory states. The memory states are selected from a finite set of possible states, and each state corresponds to a certain nominal analog value. For example, a 2 bit/cell MLC can be programmed to assume one of four possible memory states by writing one of four possible nominal analog values into the cell.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, R/W unit 40 converts the electrical charge, and thus the analog voltages of memory cells 32, into digital samples having a resolution of one or more bits. The samples are cached in buffers 36. The operation and timing of memory device 24 is managed by control logic 48.

The storage and retrieval of data in and out of memory device 24 is performed by a Memory Signal Processor (MSP) 52. MSP 52 comprises a signal processing unit 60, which processes the data that is written into and read from device 24.

In some embodiments, unit 60 encodes the data to be written into the memory cells using an Error Correction Code (ECC), and decodes the ECC of the retrieved data. Unit 60 may use any suitable type of ECC. ECC schemes that may be used by unit 60 may comprise, for example, various block codes such as Bose-Chaudhuri-Hocquenghem (BCH) codes, Reed-Solomon (RS) codes, Low Density Parity Check (LDPC) codes, turbo codes or a turbo product codes (TPC). Alternatively, unit 60 may use a convolutional ECC, a concatenated ECC, a trellis code or other signal-space code, or a multi-level ECC.

In particular, MSP 52 carries out methods for reducing the latency of reading data from memory cells 32 of array 28, as will be described in detail below.

MSP 52 comprises a data buffer 72, which is used by unit 60 for storing data and for interfacing with memory device 24. MSP 52 also comprises an Input/Output (I/O) buffer 56, which forms an interface between the MSP and the host system. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which memory array 28 is disposed. Further alternatively, some or all of the functionality of MSP 52 can be implemented in software and carried out by a processor or other element of the host system. In some implementations, a single MSP 52 may be connected to multiple memory devices 24.

In a typical writing operation, data to be written into memory device 24 is accepted from the host and cached in I/O buffer 56. The data is transferred, via data buffers 72, to memory device 24. The data may be pre-processed by MSP 52 before it is transferred to the memory device for programming. For example, unit 60 may encode the data using an ECC, add certain data for internal use, and/or scramble the data. In device 24 the data is temporarily stored in buffers 36. R/W unit 40 converts the data to nominal analog values and writes the nominal values into the appropriate cells 32 of array 28.

In a typical reading operation, R/W unit 40 reads analog values out of the appropriate memory cells 32 and converts them to soft digital samples. The samples are cached in buffers 36 and transferred to buffers 72 of MSP 52. In some embodiments, unit 60 of MSP 52 converts the samples to data bits.

Memory cells 32 of array 28 are arranged in a grid having multiple rows and columns. Each cell 32 typically comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

The rows are commonly referred to as word lines and the columns are commonly referred to as bit lines of the memory array. The memory cell array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some SLC devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line is often partitioned into four pages (odd/even order cells, least/most significant bit of the cells). Three-bit-per cell devices often have 192 pages per erasure block, and four-bit-per-cell devices often have 256 pages per block. Alternatively, other block sizes and configurations can also be used.

Low-Latency Storage and Retrieval

When retrieving data from memory, the host processor or application inevitably encounters some reading latency. Some memory controllers and host applications are sensitive to high reading latency values, and it is therefore desirable to keep the reading latency at a minimum.

As noted above, low reading latency can be achieved by using expensive and/or low density memory devices, such as NOR Flash cells instead of NAND cells, or SLC instead of MLC. The methods and systems described herein provide both low reading latency and low device cost simultaneously by splitting the storage of each data item between two types of memory cells, one type having lower reading latency than the other. The beginning of each data item is stored in low-latency cells and the remaining part of the data item is stored in higher-latency cells. When retrieving a data item, the beginning of the data item is first read from the low-latency cells and provided as output. In parallel to preparing and outputting the beginning of the data item, the remaining part is read from the higher-latency cells.

Each Data item that is stored using the methods described herein comprises data of a given type, such as text, binary data, digital video or audio media, digital voice, or any other suitable data type. This data is often referred to as user data or payload. The data item may also comprise metadata or header information. The methods described herein do not differentiate between headers, metadata and user data of the given type when dividing the data item between the lower-latency and higher-latency cells. Thus, parts of the user data are stored in both cell types.

The description that follows refers to a processor or controller, which carries out the methods described herein. The processor may comprise an MSP, such as in the configuration of FIG. 1 above, a dedicated memory controller device, a processor of the host system, or any other suitable processor or controller.

Figure 2:
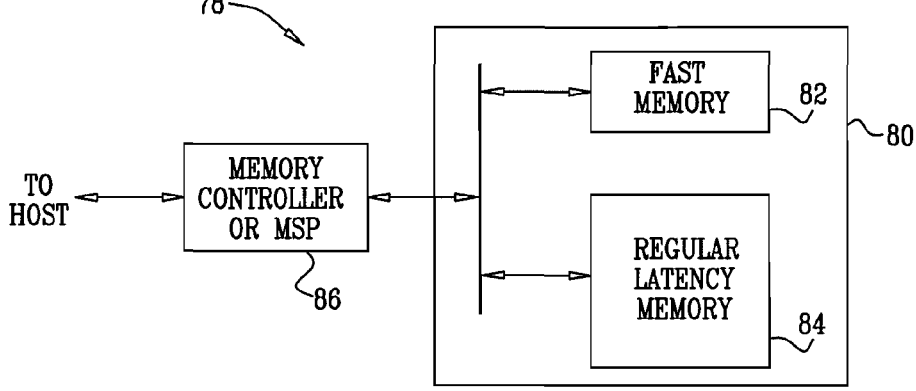

FIG. 2 is a block diagram that schematically illustrates a system 78 for data storage and retrieval, in accordance with an embodiment of the present invention. System 78 comprises a memory 80, which comprises a fast memory 82 and a slower memory 84. Memory 84 is also referred to as a "regular latency memory." Memory 82 comprises lower-latency memory cells, while memory 84 comprises higher-latency memory cells. Typically, the number of lower-latency cells is considerably smaller than the number of higher-latency cells. A processor 86 stores and retrieves data in and out of memories 82 and 84 of memory 80.

The terms "slow," "fast," "regular," "lower-latency" and "higher-latency" refer to the latency encountered by processor 86 when retrieving data that is stored in the cells of memories 82 and 84. These terms do not imply any absolute latency figures, but are used in a relative sense to define that memory 82 has a smaller reading latency than memory 84.

In some embodiments, memory 82 and memory 84 comprise memory cells of different technologies. For example, memory 82 may comprise a NOR Flash memory and memory 84 may comprise a NAND Flash memory. Alternatively, memory 82 may comprise a SLC memory and memory 84 may comprise a MLC memory. Further alternatively, any other suitable types of memory cells can be used as lower- and higher-latency cells. Memories 82 and 84 may comprise separate packaged memory devices, or separate dies that are packaged in a single device package.

In an alternative embodiment, memory 82 and memory 84 comprise cells of the same technology (e.g., different cells in the same memory cell array), which are configured or programmed differently and thus have different reading latencies. For example, memory cells that are physically similar to one another can be operated as either SLC or MLC, as appropriate.

More generally, the reading latency of analog memory cells often depends on the number of levels used for programming the cells. In other words, dense analog memory cells that are programmed with a large number of levels usually have a high reading latency, and vice versa. The dependence of the reading latency on the number of levels is explained in detail further below. Thus, analog memory cells (in the same array or in different arrays) can be programmed using different numbers of levels to provide different latency/density trade-offs.

In some multi-level memory cells, different bits within a given cell may have different reading latencies, such as because of the different number of threshold comparison operations carried out for reading different bits. In some embodiments, the processor writes data that is intended to have low reading latency in the lower-latency bits, and data that is intended to have higher reading latency in the higher-latency bits. In some memory configurations, some memory pages are mapped to the Least Significant Bits (LSB) of the memory cells, and other memory pages are mapped to bits of higher significance. Thus, the processor can write the first part of each data item in pages that are mapped to lower-latency bits.

The methods and systems described herein are not limited to the use of non-volatile memory technologies. For example, memory 82 may comprise a Random Access Memory (RAM), such as a Static RAM (SRAM). In these embodiments, processor 86 caches the beginning of each data item in memory 82. When retrieving the data item, the beginning of the data item is read from the SRAM with small latency, and the remaining part of the data item is fetched from memory 84 in parallel.

In some embodiments, the processor encodes the data using an Error Correction Code (ECC) prior to storing it in memory 80. In these embodiments, the processor may encode the parts of the data intended to have lower and higher reading latencies using different ECC schemes having different decoding latencies. For example, the first part of each data item can be encoded with relatively small ECC blocks, thus achieving low reading latency at the expense of higher error probability. The remaining part of the data item is encoded with larger ECC blocks, thus providing better error correction capability but higher reading latency.

Alternatively, the processor may use different codes for lower-latency and higher-latency storage. For example, the processor may encode the first part of each data item with a BCH code, and the second part with LDPC.

ECC schemes having higher decoding latencies often have better error correction capabilities, and vice versa. In some embodiments, the processor stores the low-latency data in memory cells that are expected to have less distortion, so as to match the strength of the ECC scheme with the properties of the cells. Any suitable criterion can be used for selecting the lower-distortion cells.

For example, cells that have gone through a smaller number of programming and erasure cycles are expected to have less distortion. Thus, the processor may assign memory cells for storing the data encoded with the different coding schemes based on the amount of wear the cells have gone through. The processor may designate the cells whose number of previous programming and erasure cycles is lower than a certain threshold (e.g., 100 cycles) for storing the first part of each data item. For this purpose, the processor may allow only limited access to a certain area of the memory, so as to preserve a certain number of "fresh" cells throughout the lifetime of the memory device.

Figure 3:
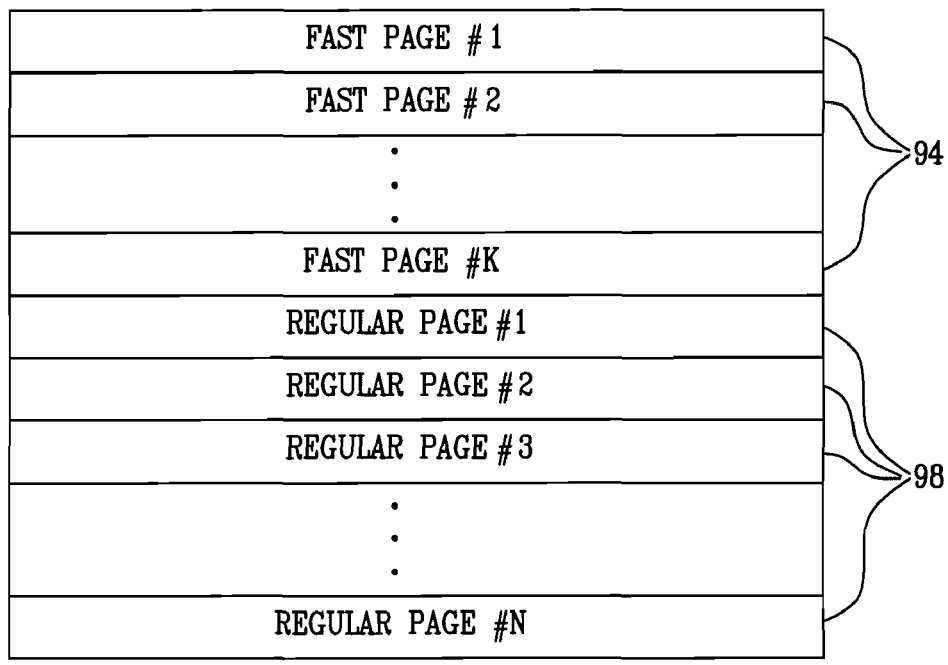
FIG. 3 is a diagram that schematically illustrates a memory, in accordance with an embodiment of the present invention.

FIG. 3 is a diagram that schematically illustrates a memory 90, which can be used to implement memory 80 of FIG. 2 above, in accordance with an embodiment of the present invention. Memory 90 comprises K fast pages 94 (i.e., pages of lower-latency cells) and N regular pages 98 (i.e., pages of higher-latency cells). Typically, K and N are chosen so that K<<N. The fast and regular pages may reside in a single cell array or in different arrays, in the same erasure block or in different blocks, or on separate dies.

When storing a certain data item $D_i$, such as a file, in array 90, the processor assigns this data item $K_i$ fast pages and $N_i$ regular pages. The number of assigned fast and/or regular pages may differ from one data item to another. Typically, the total number of fast pages is considerably smaller than the total number of regular pages when summed over the collection of files stored in memory 90, i.e., $$\sum_i K_i \ll \sum_i N_i.$$

Figure 4:
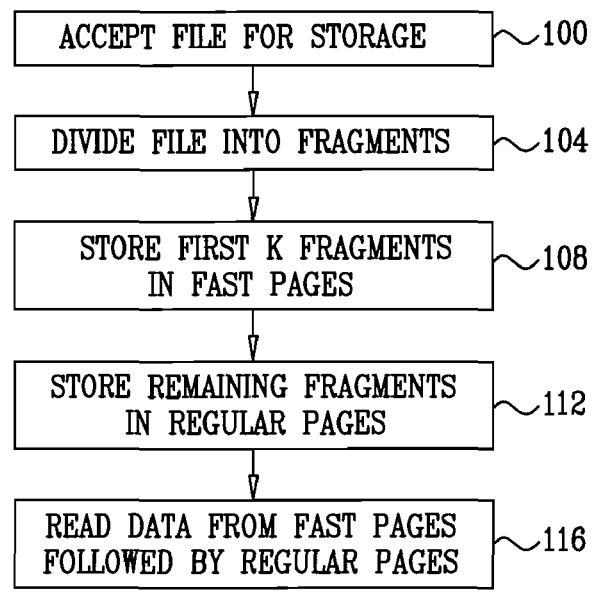
FIG. 4 is a flow chart that schematically illustrates a method for data storage and retrieval, in accordance with an embodiment of the present invention.

FIG. 4 is a flow chart that schematically illustrates a method for data storage and retrieval, in accordance with an embodiment of the present invention. The method begins with processor 86 accepting a data item $D_i$ (e.g., a file) for storage in memory 90, at an input step 100. The processor divides the data item into fragments, at a partitioning step 104. In the present example, each fragment contains an amount of data suitable for storage in a single page of memory 90. Alternatively, fragments may correspond to sectors, erasure blocks or any other suitable group of cells.

The processor stores the first $K_i$ fragment of the data item in $K_i$ fast pages of memory 90, at a fast page storage step 108. The processor stores the remaining fragment of the data item in $N_i$ regular pages of memory 90, at a regular page storage step 112.

When the host requests processor 86 to retrieve data item $D_i$, the processor first reads the data stored in the fast pages, and then the data stored in the regular pages, at a retrieval step 116. The processor initially reads the data stored in the fast pages, prepares them for output and outputs their content to the host. This operation has low reading latency. In parallel to preparing and outputting the data read from the fast pages, the processor reads the data stored in the regular pages. The processor then prepares and outputs the data read from the regular pages to the host. Thus, the reading latency seen by the host is the reading latency of the fast pages, even though most of the data of $D_i$ is stored in regular pages.

Figure 5:
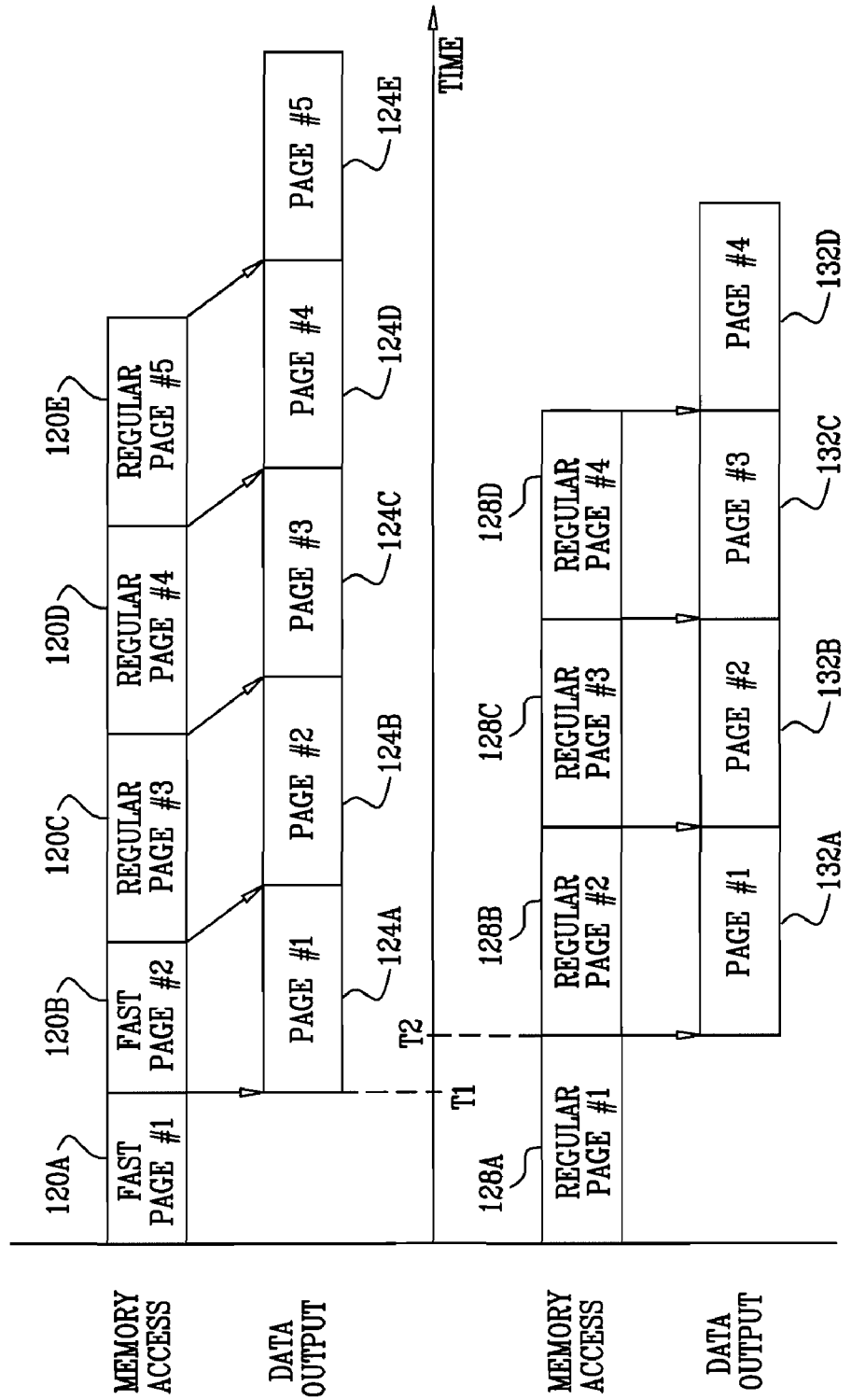
FIG. 5 is a timing diagram that schematically illustrates a method for data storage and retrieval, in accordance with an embodiment of the present invention.

FIG. 5 is a timing diagram that schematically illustrates a method for data storage and retrieval, in accordance with an embodiment of the present invention. The top of the figure (above the horizontal time axis) shows the timing of memory access and data output operations performed by processor 86 when using a combination of fast and regular pages, as explained above. The bottom of the figure (below the horizontal axis) shows a scheme that uses only regular pages, as a reference.

The timing scheme at the top of the figure shows the process of retrieving a data item, which is stored in two fast pages 120A and 120B and three regular pages 120C . . . 120E. When the processor is requested to retrieve this data item, it initially fetches fast page 120A from the lower-latency memory, and then prepares and outputs this page to the host as an output page 124A. The first output page appears on the host interface at a reading latency denoted T1. In parallel to preparing and outputting output page 124A, the processor fetches fast page 120B from the lower-latency memory. The processor outputs this page as an output page 124B, immediately following output page 124A.

From this stage, the processor fetches and prepares regular pages 120C . . . 120E from the higher-latency memory, and outputs them as output pages 124C . . . 124E, respectively.

Thus, the host is provided with a sequence of output pages 124A . . . 124E, which begins at a reading latency T1, the reading latency of the fast pages.

The bottom of FIG. 5 demonstrates the higher latency achieved when using only regular pages. In this scheme, the processor fetches a data item, which is stored in regular pages 128A . . . 128D, and outputs the data in respective output pages 132A . . . 132D. The data begins to appear on the host interface at a reading latency of T2, which is higher than T1. Note that in some embodiments, such as when the fast pages comprise SLC and the regular pages comprise MLC, the technique described above also reduces programming latency.

Figure 6A:
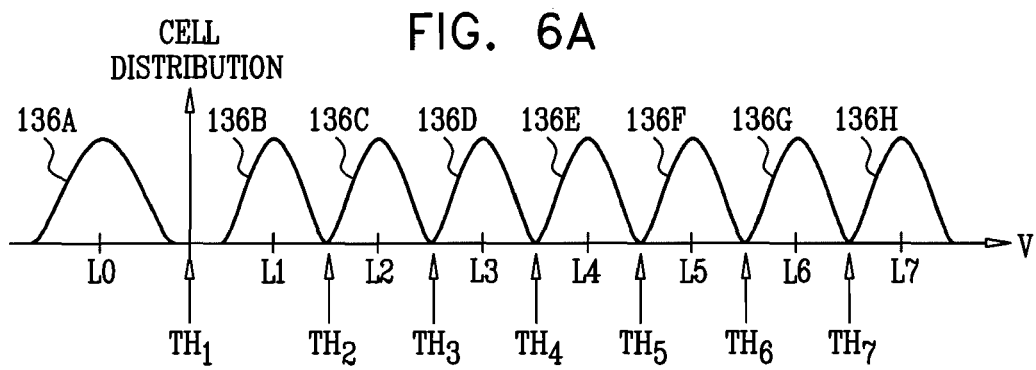
FIGS. 6A-6D are diagrams that schematically illustrate voltage distributions in a memory cell array, in accordance with an embodiment of the present invention.
Figure 6B:
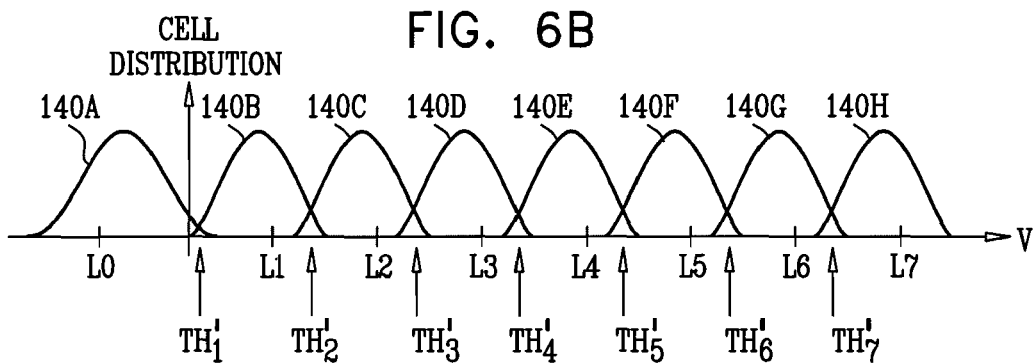
Figure 6C:
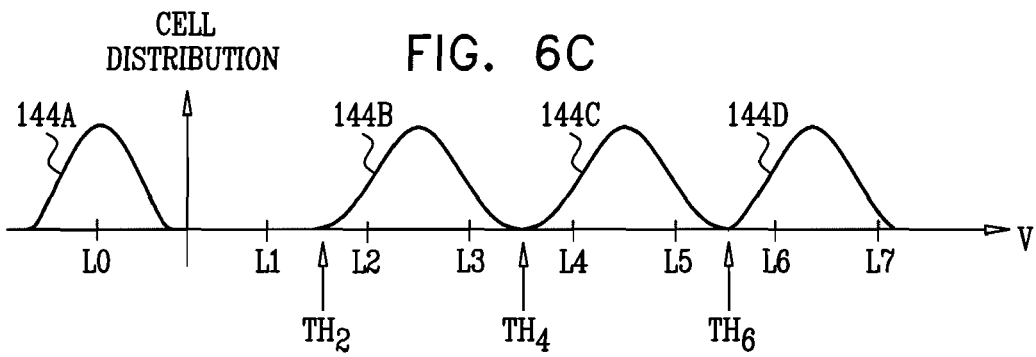
Figure 6D:
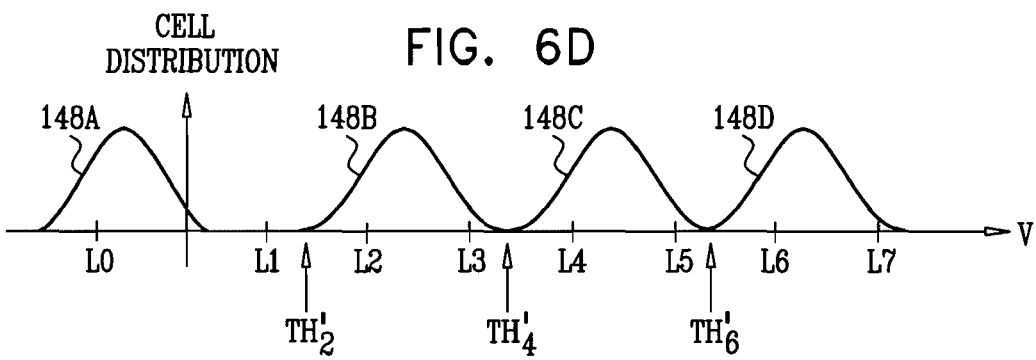

Adjusting Read Thresholds of Regular Pages Using Previously-Retrieved Fast Pages FIGS. 6A-6D are diagrams that schematically illustrate voltage distributions in a memory cell array, in accordance with an embodiment of the present invention. FIGS. 6A and 6B show the voltage distributions in the higher-latency cells, while FIGS. 6C and 6D show the voltage distributions in the lower-latency cells. In the present example, the processor programs the higher-latency cells using eight possible levels, thus storing three bits per cell. The lower-latency cells are programmed using only four possible levels, thus storing two bits per cell.

Referring to FIG. 6A, data is stored in the higher-latency cells by programming the cells to eight possible levels denoted L0 . . . L7. The actual analog values (e.g., threshold voltages) of the cells vary statistically around these levels, in accordance with distributions 136A . . . 136H. Distributions 136A . . . 136H reflect the distribution of analog values immediately after the cells are programmed. Data is read from the higher-latency cells by comparing the analog values read from the cells to a set of seven reading thresholds denoted $TH_1$ . . . $TH_7$, which are positioned between the voltage distributions.

FIG. 6B shows the analog value distribution in the higher-latency cells, after the cells have aged, i.e., have gone through a certain retention period and/or various impairment effects (e.g., multiple programming and erasure cycles, interference from neighboring cells and/or temperature shift effects). The figure shows eight distributions 140A . . . 140H, which are typically wider than distributions 136A . . . 136H and are also shifted with respect to the nominal levels L0 . . . L7. Consequently, the optimal positions of the reading thresholds have also shifted, and are now denoted $TH_1'$ . . . $TH_7'$.

FIG. 6C shows the voltage distributions in the lower-latency cells, immediately after the cells are programmed. The figure shows four voltage distributions 144A . . . 144D, which correspond to the four levels used for programming these cells.

FIG. 6D shows the voltage distributions in the lower-latency cells after the cells have aged. The figure shows four distributions 148A . . . 148D, which are shifted with respect to the corresponding distributions 144A . . . 144D.

The error performance of the data retrieval process is highly sensitive to the correct positioning of the reading thresholds. As can be clearly seen in FIGS. 6A . . . 6D, the sensitivity to the positions of the reading thresholds increases sharply with the number of levels.

In some implementations, the positions of the reading thresholds are determined and possibly adjusted before data can be read successfully. When the number of levels is small, threshold adjustment may be coarse and can sometimes be omitted. When the number of levels is high, on the other hand, the reading thresholds are adjusted with high accuracy in order to successfully decode the data. The higher reading latency associated with cells having a large number of levels is partly due to the accurate threshold adjustment process that is needed for proper data retrieval.

In some embodiments of the present invention, the processor uses the decoding results of the lower-latency cells, which are decoded first, to adjust the reading thresholds of the higher-latency cells. Thus, the latency of the higher-latency cells can be reduced considerably.

FIG. 7 is a flow chart that schematically illustrates a method for data storage and retrieval, in which the decoding results of the higher-latency cells are adjusted based on the decoding results of the lower-latency cells, in accordance with an embodiment of the present invention.

The method begins with processor 86 programming the lower-latency cells using M levels, at a first programming step 150. The processor programs the higher-latency cells using N levels, N>M, at a second programming step 154. Specifically, the processor programs the lower-latency cells using a subset of the levels used for programming the higher-latency cells.

When retrieving a certain data item, the processor first retrieves and decodes the part of the data item that is stored in the low-latency cells, at a first decoding step 158. The processor decodes the data using a subset of the reading thresholds used for reading the higher-latency cells.

Referring to the example of FIGS. 6A-6D, the processor programs the higher-latency cells using eight levels and the lower-latency cells using four levels. The processor reads the data from the higher-latency cells using seven thresholds $TH_1$ . . . $TH_7$, and from the lower-latency cells using three thresholds $TH_2$, $TH_4$ and $TH_6$.

Since the lower-latency cells are programmed with only four levels, the processor is likely to successfully decode the data from these cells, even when the reading thresholds are not set to their optimal positions. Typically, the number of errors resulting from non-optimal threshold positions is within the correction capability of the ECC.

In the higher-latency cells that are programmed with eight levels, however, the ECC may not be able to correct the errors caused by the non-optimal threshold positions. For example, in a certain implementation, an ECC having a correction capability of 16 errors per page is able to overcome ±60 mV threshold deviations in the four-level cells, but only ±20 mV threshold deviations in the eight-level cells.

Thus, processor 86 adjusts the reading thresholds of the higher-latency cells based on the decoding results of the low-latency cells, at a threshold adjustment step 162. This technique assumes that the impairment mechanisms, e.g., aging, are similar in the two cell types.

In some embodiments, the processor determines the desired threshold adjustment based on the errors in the low-latency cells that were corrected by the ECC. For example, the processor may adjust the reading thresholds based on a comparison between (1) the number of errors in which "1" data was corrected to "0" and (2) the number of errors in which "0" data was corrected to "1". This comparison may indicate a non-optimal threshold position, as well as the direction and size of the desired adjustment. Alternatively, the processor may compare the number of "1" bits with the number of "0" in the decoded data. Assuming the stored data is balanced, an imbalance in the decoded data may indicate a non-optimal threshold position, and/or the direction and size of the appropriate correction.

Some aspects of threshold adjustment based on ECC results are described in PCT Application PCT/IL2007/001315, entitled "Reading Memory Cells using Multiple Thresholds," filed Oct. 30, 2007, whose disclosure is incorporated herein by reference. Further alternatively, the processor may use any other suitable method for adjusting the reading thresholds of the higher-latency cells based on the data read from the lower-latency cells.

The processor reads the data from the high-latency cells using the adjusted reading thresholds. Since the threshold positions are improved by the adjustment process of step 162 above, the reading latency of the higher-latency cells can be reduced considerably. In some embodiments, the processor uses the adjusted thresholds as is. In an alternative embodiment, the processor carries out a short threshold adaptation process before reading the data from the higher-latency cells. The threshold adaptation process uses the adjusted thresholds produced at step 162 as initial conditions, and therefore its length is significantly reduced.

In some embodiments, the lower-latency memory cells can be programmed more accurately than the higher-latency memory cells. For example, when the cells are programmed using an iterative Program and Verify (P&V) process, as is known in the art, the lower-latency cell can be programmed using a smaller P&V step size. Programming of cells with high accuracy reduces the reading latency of these cells, as it relaxes the requirements from processes such as ECC decoding, threshold setting and interference cancellation.

Although the embodiments described herein mainly address storing data in solid-state memory devices, the principles of the present invention can also be used for storing and retrieving data in Hard Disk Drives (HDD) and other data storage media and devices. For example, the methods and systems described herein can be used in a system for accelerating file retrieval from HDDs. In such a configuration, data is stored in a system that combines a HDD (used as higher-latency memory) and a non-volatile memory device (used as lower-latency memory. Such a system would store a first part of each data item in the non-volatile memory, and a second part of the data item in the HDD. Thus, the data item can be rapidly retrieved by first reading the first part from the non-volatile memory, and reading the second part from the HDD in parallel to outputting the first part.

In some embodiments, such as in the HDD acceleration system described above, the entire data item may be stored in the higher-latency memory, in addition to storing the first part of the data item in the lower-latency memory.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
    providing a memory, which comprises first memory cells having a first reading latency and second memory cells having a second reading latency that is higher than the first reading latency;
    dividing an item of data intended for storage in the memory into first and second parts;
    storing the first part in the first memory cells and the second part in the second memory cells; and
    in response to a request to retrieve the item of data from the memory, reading the first part from the first memory cells and outputting the read first part, reading the second part from the second memory cells, and outputting the read second part subsequently to outputting the first part.

2. The method according to claim 1, wherein reading the second part comprises reading the second part concurrently with outputting the first part.

3. The method according to claim 1, wherein the first and second memory cells are formed using respective, different first and second memory device technologies.

4. The method according to claim 3, wherein the first memory cells comprise NOR Flash cells and wherein the second memory cells comprise NAND Flash cells.

5. The method according to claim 1, wherein the memory comprises an array of analog memory cells, and wherein the first and second memory cells comprise respective first and second groups of the memory cells in the array.

6. The method according to claim 1, wherein storing the first part comprises programming the first memory cells using a first number of nominal analog values to assume a respective first number of possible memory states, and wherein storing the second part comprises programming the second memory cells using a second number of the nominal analog values, which is greater than the first number, to assume a respective second number of the memory states.

7. The method according to claim 6, wherein the first memory cells comprise Single-Level Cells (SLC), and wherein the second memory cells comprise Multi-Level Cells (MLC).

8. The method according to claim 6, wherein the first number of the nominal analog values comprises four, and the second number of the nominal analog values comprises eight.

9. The method according to claim 6, wherein reading the first part comprises comparing first analog values stored in the first memory cells to a first set of reading thresholds, wherein reading the second part comprises comparing second analog values stored in the second memory cells to a second set of the reading thresholds, and comprising adjusting the second set of the reading thresholds responsively to the read first part.

10. The method according to claim 9, wherein storing the first part comprises encoding the first part using an Error Correction Code (ECC), wherein reading the first part comprises decoding the ECC, and wherein adjusting the second set of the reading thresholds comprises detecting errors in the read first part that were corrected by the ECC and adjusting the second set responsively to the detected corrected errors.

11. The method according to claim 1, wherein the first memory cells comprise Random Access Memory (RAM) cells.

12. The method according to claim 1, wherein the item of data comprises user data of a given type, and wherein dividing the item of the data comprises dividing the user data of the given type such that each of the first and second parts comprises a portion of the user data.

13. The method according to claim 1, wherein the first and second memory cells are arranged in respective first and second sets of memory pages, wherein dividing the item of the data comprises dividing the item into multiple fragments, assigning a number of the fragments to the first part and a remaining number of the fragments to the second part, and wherein storing the first and second parts comprises storing the number of the fragments in a subset of the first set of the memory pages and storing the remaining number of the fragments in a subset of the second set of the memory pages.

14. The method according to claim 1, wherein storing the first and second parts comprise encoding the first part of the item using a first Error Correction Code (ECC) scheme having a first decoding latency, and encoding the second part of the item using a second ECC scheme having a second decoding latency, which is greater than the first decoding latency.

15. The method according to claim 14, wherein encoding the first part comprises applying a first ECC, and wherein encoding the second part comprises applying a second ECC that is different from the first ECC.

16. The method according to claim 14, wherein the first ECC scheme has a first ECC block size, and wherein the second ECC scheme has a second ECC block size that is larger that the first block size.

17. The method according to claim 14, wherein storing the first part comprises selecting the first memory cells responsively to a level of distortion in the cells.

18. The method according to claim 17, wherein selecting the first memory cells comprises selecting the cells based on a number of previous programming and erasures cycles of the cells.

19. Apparatus for data storage, comprising:
a memory, which comprises first memory cells having a first reading latency and second memory cells having a second reading latency that is higher than the first reading latency; and
a processor, which is coupled to divide an item of data intended for storage in the memory into first and second parts, to store the first part in the first memory cells and the second part in the second memory cells, and, in response to a request to retrieve the item of data from the memory, to read the first part from the first memory cells and output the read first part, to read the second part from the second memory cells, and to output the read second part subsequently to outputting the first part.

20. The apparatus according to claim 19, wherein the processor is coupled to read the second part concurrently with outputting the first part.

21. The apparatus according to claim 19, wherein the first and second memory cells are formed using respective, different first and second memory device technologies.

22. The apparatus according to claim 21, wherein the first memory cells comprise NOR Flash cells and wherein the second memory cells comprise NAND Flash cells.

23. The apparatus according to claim 19, wherein the memory comprises an array of analog memory cells, and wherein the first and second memory cells comprise respective first and second groups of the memory cells in the array.

24. The apparatus according to claim 19, wherein the processor is coupled to program the first memory cells using a first number of nominal analog values to assume a respective first number of possible memory states, and to program the second memory cells using a second number of the nominal analog values, which is greater than the first number, to assume a respective second number of the memory states.

25. The apparatus according to claim 24, wherein the first memory cells comprise Single-Level Cells (SLC), and wherein the second memory cells comprise Multi-Level Cells (MLC).

26. The apparatus according to claim 24, wherein the first number of the nominal analog values comprises four, and the second number of the nominal analog values comprises eight.

27. The apparatus according to claim 24, wherein the processor is coupled to read the first part by comparing first analog values stored in the first memory cells to a first set of reading thresholds, to read the second part by comparing second analog values stored in the second memory cells to a second set of the reading thresholds, and to adjust the second set of the reading thresholds responsively to the read first part.

28. The apparatus according to claim 27, wherein the processor is coupled to encode the first part using an Error Correction Code (ECC) when storing the first part, to decode the ECC when reading the first part, to detect errors in the read first part that were corrected by the ECC, and to adjust the second set responsively to the detected corrected errors.

29. The apparatus according to claim 19, wherein the first memory cells comprise Random Access Memory (RAM) cells.

30. The apparatus according to claim 19, wherein the item of data comprises user data of a given type, and wherein the processor is coupled to divide the user data of the given type such that each of the first and second parts comprises a portion of the user data.

31. The apparatus according to claim 19, wherein the first and second memory cells are arranged in respective first and second sets of memory pages, and wherein the processor is coupled to divide the item into multiple, fragments, to assign a number of the fragments to the first part and a remaining number of the fragments to the second part, to store the number of the fragments in a subset of the first set of the memory pages and to store the remaining number of the fragments in a subset of the second set of the memory pages.

32. The apparatus according to claim 19, wherein the processor is coupled to encode the first part of the item using a first Error Correction Code (ECC) scheme having a first decoding latency, and to encode the second part of the item using a second ECC scheme having a second decoding latency, which is greater than the first decoding latency.

33. The apparatus according to claim 32, wherein the processor is coupled to encode the first part with a first ECC, and to encode the second part with a second ECC that is different from the first ECC.

34. The apparatus according to claim 32, wherein the first ECC scheme has a first ECC block size, and wherein the second ECC scheme has a second ECC block size that is larger that the first block size.

35. The apparatus according to claim 32, wherein the processor is coupled to select the first memory cells responsively to a level of distortion in the cells.

36. The apparatus according to claim 35, wherein the processor is coupled to select the cells based on a number of previous programming and erasures cycles of the cells.

37. Apparatus for data storage, comprising:
an interface, which is coupled to communicate with a memory that includes first memory cells having a first reading latency and second memory cells having a second reading latency that is higher than the first reading latency; and
a processor, which is coupled to divide an item of data intended for storage in the memory into first and second parts, to store the first part in the first memory cells and the second part in the second memory cells, and, in response to a request to retrieve the item of data from the memory, to read the first part from the first memory cells and output the read first part, to read the second part from the second memory cells, and to output the read second part subsequently to outputting the first part.

38. A method for operating a memory that includes a plurality of analog memory cells, comprising:
storing first data in a first group of the analog memory cells by programming the cells of the first group using a first number of nominal analog values to assume a respective first number of possible memory states;
storing second data in a second group of the analog memory cells by programming the cells of the second group using a second number of the nominal analog values to assume a respective second number of the possible memory states, which is greater than the first number;

reading the first data by comparing first analog values stored in the cells of the first group to a first set of reading thresholds;

reading the second data by comparing second analog values stored in the cells of the second group to a second set of the reading thresholds; and adjusting the second set of the reading thresholds responsively to the read first part.

39. The method according to claim 38, wherein storing the first data comprises encoding the first data using an Error Correction Code (ECC), wherein reading the first data comprises decoding the ECC, and wherein adjusting the second set of the reading thresholds comprises detecting errors in the read first data that were corrected by the ECC and adjusting the second set responsively to the detected corrected errors.

40. A method for data storage, comprising:

providing a memory comprising a plurality of memory cells, wherein each memory cell stores at least first and second bits, such that the first bits of the memory cells have a first reading latency and the second bits of the memory cells have a second reading latency, which is higher than the first reading latency;

dividing an item of data intended for storage in the memory into first and second parts;

storing the first part in the first bits and the second part in the second bits of the memory cells; and in response to a request to retrieve the item of data from the memory, reading the first part from the first bits and outputting the read first part, reading the second part from the second bits, and outputting the read second part subsequently to outputting the first part.

* * * * *